(12) United States Patent
Daghighian et al.

(10) Patent No.: US 9,204,537 B2
(45) Date of Patent: Dec. 1, 2015

(54) HIGH-SPEED PLUGGABLE RIGID-END FLEX CIRCUIT

(71) Applicant: FINISAR CORPORATION, Sunnyvale, CA (US)

(72) Inventors: Henry Meyer Daghighian, Menlo Park, CA (US); Steve Bird, San Jose, CA (US); Bruce Sramek, Santa Rosa, CA (US)

(73) Assignee: FINISAR CORPORATION, Sunnyvale, CA (US)

(*) Notice: Subject to any disclaimer, the term of this patent is extended or adjusted under 35 U.S.C. 154(b) by 375 days.

(21) Appl. No.: 13/623,615

(22) Filed: Sep. 20, 2012

(65) Prior Publication Data

US 2014/0079403 A1    Mar. 20, 2014

(51) Int. Cl.
*H05K 1/02*    (2006.01)
*H04B 10/40*    (2013.01)
*H01P 3/08*    (2006.01)
(Continued)

(52) U.S. Cl.
CPC ............... *H05K 1/0283* (2013.01); *H01P 3/08* (2013.01); *H01P 3/088* (2013.01); *H04B 10/40* (2013.01); *H05K 1/0242* (2013.01); *H05K 1/0251* (2013.01); *H05K 1/165* (2013.01); *H05K 3/4691* (2013.01); *H05K 1/0373* (2013.01); *H05K 1/0393* (2013.01); *H05K 1/16* (2013.01); *H05K 3/4069* (2013.01); *H05K 3/429* (2013.01); *H05K 2201/015* (2013.01); *H05K 2201/0141* (2013.01); *H05K 2201/086* (2013.01); *H05K 2201/096* (2013.01); *H05K 2201/09518* (2013.01); *H05K 2201/09563* (2013.01);
(Continued)

(58) Field of Classification Search
CPC . H05K 1/0283; H05K 1/0242; H05K 1/0251; H05K 1/165; H05K 3/4691; H05K 1/028; H04B 10/40

USPC ............................................................ 333/5
See application file for complete search history.

(56) References Cited

U.S. PATENT DOCUMENTS 4,751,136 A *  6/1988  Kamiya et al. ............. 428/317.1
5,359,767 A * 11/1994  Chen et al. ....................... 29/830
(Continued)

OTHER PUBLICATIONS

Yagisawa et al., 30-Gb/s VCSEL Transmitter fabricated on flexible printed circuit substrate, 36th European Conference and Exhibition on Optical Communication (ECOC), Sep. 19-23, 2010.*
(Continued)

*Primary Examiner* — Stephen E Jones
*Assistant Examiner* — Scott S Outten
(74) *Attorney, Agent, or Firm* — Maschoff Brennan

(57) ABSTRACT

High-speed pluggable rigid-end flex circuit. A circuit includes a flexible section, rigid section, connector disposed on the rigid section, and electrically conductive signal transmission line electrically coupled to the connector. The flexible section includes a first portion of a flexible insulating layer. The rigid section includes a second portion of the flexible insulating layer and a rigid insulating layer disposed on the second portion of the flexible insulating layer. The connector is configured to form a pluggable conductive connection. The electrically conductive signal transmission line includes a first signal trace having a root mean square surface roughness below 20 micrometers and a filled signal via configured to pass through at least a portion of the rigid insulating layer. The flexible and rigid insulating layers have a dissipation factor equal to or below a ratio of 0.004 and a dielectric constant equal to or below a ratio of 3.7.

20 Claims, 8 Drawing Sheets

(51) Int. Cl.
*H05K 3/46* (2006.01)
*H05K 1/03* (2006.01)
*H05K 1/16* (2006.01)
*H05K 3/40* (2006.01)
*H05K 3/42* (2006.01)

(52) U.S. Cl.
CPC ............ *H05K2201/10121* (2013.01); *H05K 2201/10189* (2013.01); *H05K 2201/2009* (2013.01)

(56) References Cited

U.S. PATENT DOCUMENTS

| | | | |
|---|---|---|---|
| 6,147,505 A * | 11/2000 | Ott et al. | 324/754.15 |
| 7,507,103 B1 * | 3/2009 | Phillips et al. | 439/352 |
| 8,279,611 B2 * | 10/2012 | Wong et al. | 361/749 |
| 2008/0044141 A1 * | 2/2008 | Willis et al. | 385/88 |
| 2011/0069460 A1 * | 3/2011 | Clayton et al. | 361/749 |
| 2011/0269346 A1 * | 11/2011 | Casher et al. | 439/626 |
| 2011/0294308 A1 * | 12/2011 | Kuwata et al. | 439/55 |

OTHER PUBLICATIONS

Balogh et al., Rigid-Flexible Interconnection realized by laser soldering through polyimide, 2nd Electronics System-Integration Technology Conference, Sep. 1-4, 2008, pp. 863-866.*

Huynh et al., High-Speed Board-To-Board Interconnects Utilizing Flexible Foils and Elastomeric Connectors, Jun. 2006, Conference on High Density Microsystem Design and Packaging and Component Failur Analysis.*

* cited by examiner

HIGH-SPEED PLUGGABLE RIGID-END FLEX CIRCUIT

BACKGROUND

1. Field

The embodiments discussed herein relate to high-speed circuits. In particular, embodiments relate to circuit boards with both flexible and rigid sections for use in optoelectronic devices.

2. Relevant Technology

Optoelectronic modules, such as optoelectronic transceiver or transponder modules, are increasingly used in electronic and optoelectronic communication. Optoelectronic modules generally include an outer housing that at least partially encloses one or more transmitters and/or receivers, as well as one or more printed circuit boards (PCBs) with circuitry related to the transmitters/receivers, such as driving and amplifying circuitry. Electrical data signals generally pass through this circuitry as they pass between the transmitters/receivers and a host device in which the optoelectronic module is positioned.

It is desirable for optoelectronic communication to send and receive data signals having ever higher frequencies in order to increase the rate at which data may be communicated via the optoelectronic modules. However, increasing data signal frequencies may present a number of difficulties in designing optoelectronics modules. In particular, increasing data signal frequencies may lead to signal degradation in circuits designed using techniques acceptable for lower data signal frequencies.

In some instances, the design of certain aspects of optoelectronic modules is constrained by Multi-Source Agreements (MSAs). MSAs govern particular aspects of the module to allow the module to be plugged into a host device designed in compliance with the MSA. Aspects specified by the MSA may include housing dimensions, as well as connector dimensions and placement. In some instances, MSAs may require that the module include a dual-side rigid edge connector for forming a pluggable communication connection with a host device.

Using flexible PCBs within the optoelectronic devices may offer a number of advantages. For example, flexible PCBs may allow an efficient use of space within the optoelectronic device, particularly where the flexible PCBs are contorted to transition from the dual-side rigid edge connector to the transmitters/receivers, which may be oriented perpendicular to the rigid edge connector. A PCB may be fabricated with both rigid and flexible sections. Such PCBs are commonly described as "rigid flex" PCBs.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Embodiments described herein generally relate to systems for transmission of high-speed signals. In particular, embodiments may relate to circuit boards with both flexible and rigid sections for use in optoelectronic devices.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In one embodiment, a circuit includes a flexible section, a rigid section, a connector disposed on the rigid section, and an electrically conductive signal transmission line electrically coupled to the connector. The flexible section includes a first portion of a flexible insulating layer. The rigid section of the circuit includes a second portion of the flexible insulating layer and a rigid insulating layer disposed on the second portion of the flexible insulating layer. The connector of the circuit is configured to form a pluggable dual-sided electrically conductive connection. The electrically conductive signal transmission line includes a first signal trace having a root mean square surface roughness equal to or below 20 micrometers. The electrically conductive signal transmission line further includes a filled signal via configured to pass through at least a portion of the rigid insulating layer. The flexible insulating layer and the rigid insulating layer of the circuit have a dissipation factor equal to or below a ratio of 0.004 and a dielectric constant equal to or below a ratio of 3.7.

In another embodiment, an optoelectronic module includes an optical transmitter, an optical receiver, and a circuit. The circuit includes a flexible section, a rigid section, an insulating layer, an edge connector disposed on the rigid section, and an electrically conductive signal transmission line electrically coupled to the edge connector. The circuit is configured to electrically couple the optical transmitter and optical receiver with the edge connector. The edge connector is configured to form a pluggable conductive connection for the optoelectronic module with a host device. The flexible section of the circuit includes a flexible section including a first portion of a flexible insulating layer. The rigid section of the circuit includes a second portion of the flexible insulating layer and a rigid insulating layer disposed on the second portion of the flexible insulating layer. The electrically conductive signal transmission line of the circuit includes a first signal trace having a root mean square surface roughness equal to or below 20 micrometers. The electrically conductive signal transmission line also includes a filled signal via configured to pass through at least a portion of the rigid insulating layer. The flexible insulating layer and the rigid insulating layer have a dissipation factor equal to or below a ratio of 0.004 and a dielectric constant equal to or below a ratio of 3.7.

In yet another embodiment, a circuit includes a plurality of insulating layers, a plurality of differential signal transmission lines, a flexible section, and a rigid section. The plurality of insulating layers include a plurality of flexible insulating layers, a plurality of rigid insulating layers, a first cover layer, and a second cover layer. The plurality of flexible insulating layers have a dissipation factor equal to or below a ratio of 0.004 and a dielectric constant equal to or below a ratio of 3.7. The plurality of rigid insulating layers have a dissipation factor equal to or below a ratio of 0.004 and a dielectric constant equal to or below a ratio of 3.7. The first cover layer has a dissipation factor equal to or below a ratio of 0.004. The second cover layer has a dissipation factor equal to or below a ratio of 0.004. Each differential signal transmission line of the plurality of differential signal transmission lines includes two differential signal traces disposed on one or more of the plurality of insulating layers and one or more filled signal vias electrically coupled to the one or more differential signal transmission lines. The two differential signal traces have a trace width of about 45 micrometers, spacing between the at least two differential signal traces of about 55 micrometers, and a root mean square surface roughness equal to or below 20 micrometers. The one or more filled signal vias are configured to pass through at least a section of the plurality of insulating layers. The flexible section of the circuit includes a portion of the plurality of flexible insulating layers without the plurality of rigid layers disposed on the plurality of flexible insulating layers, and the first cover layer. The rigid section of the circuit includes the plurality of rigid insulating layers disposed on a portion of the plurality of flexible insulating layers, the second cover layer, and an edge connector configured to form a pluggable conductive connection. The edge connector includes a first plurality of contacts disposed on a first face of the rigid section and a second plurality of contacts disposed opposite the first plurality of contacts on a second face of the rigid section opposite the first face of the rigid section. Some of the first plurality of contacts and the second plurality of contacts are electrically coupled to the plurality of differential signal transmission lines. Each contact of the first plurality of contacts and the second plurality of contacts is plated with at least 30 micro-inches of nickel gold.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DESCRIPTION OF EMBODIMENTS

One problem with traditional dual-side connector rigid flex PCBs is that ordinary rigid flex PCB design techniques may be used to create optoelectronics circuits for only relatively low-speed data transmission frequencies. However, as data signal frequencies increase, using ordinary rigid flex PCB design techniques to create a high-speed optoelectronic circuit results in unacceptable signal degradation. For example, signal degradation may occur due to feed-through vias, transmission line interconnects and/or interfaces, and/or low impedance ground connections running from the top of the rigid section to the bottom of the rigid section. As a result, rigid flex PCBs developed using ordinary rigid flex PCB design techniques are typically unsuitable for transmitting signals having data rates above about 14 gigabits per second (Gb/s).

To bring the signal degradation within acceptable levels, a flexible PCB and a rigid ceramic laminate such as a low-temperature co-fired ceramic (LTCC) may be soldered together using ball grid array (BGA) soldering. The ceramic laminate may include the rigid edge connector with the fine structure, high frequency vias, transmission lines, and ground reference interfaces required, while the flexible circuit may be contorted to take advantage of the three-dimensional space within the optoelectronic module. However, such a solution is expensive and demands significant assembly effort.

As disclosed by embodiments herein, a rigid flex circuit suitable for transmitting signals having data rates above 14 Gb/s can be constructed. Rigid flex circuits may be comparatively inexpensive to manufacture and/or may demand a comparatively minimal assembly effort.

Reference will now be made to figures wherein like structures will be provided with like reference designations. It is understood that the drawings are diagrammatic and schematic representations of exemplary embodiments, and are not limiting of the present invention nor are they necessarily drawn to scale.

Figure 1A:
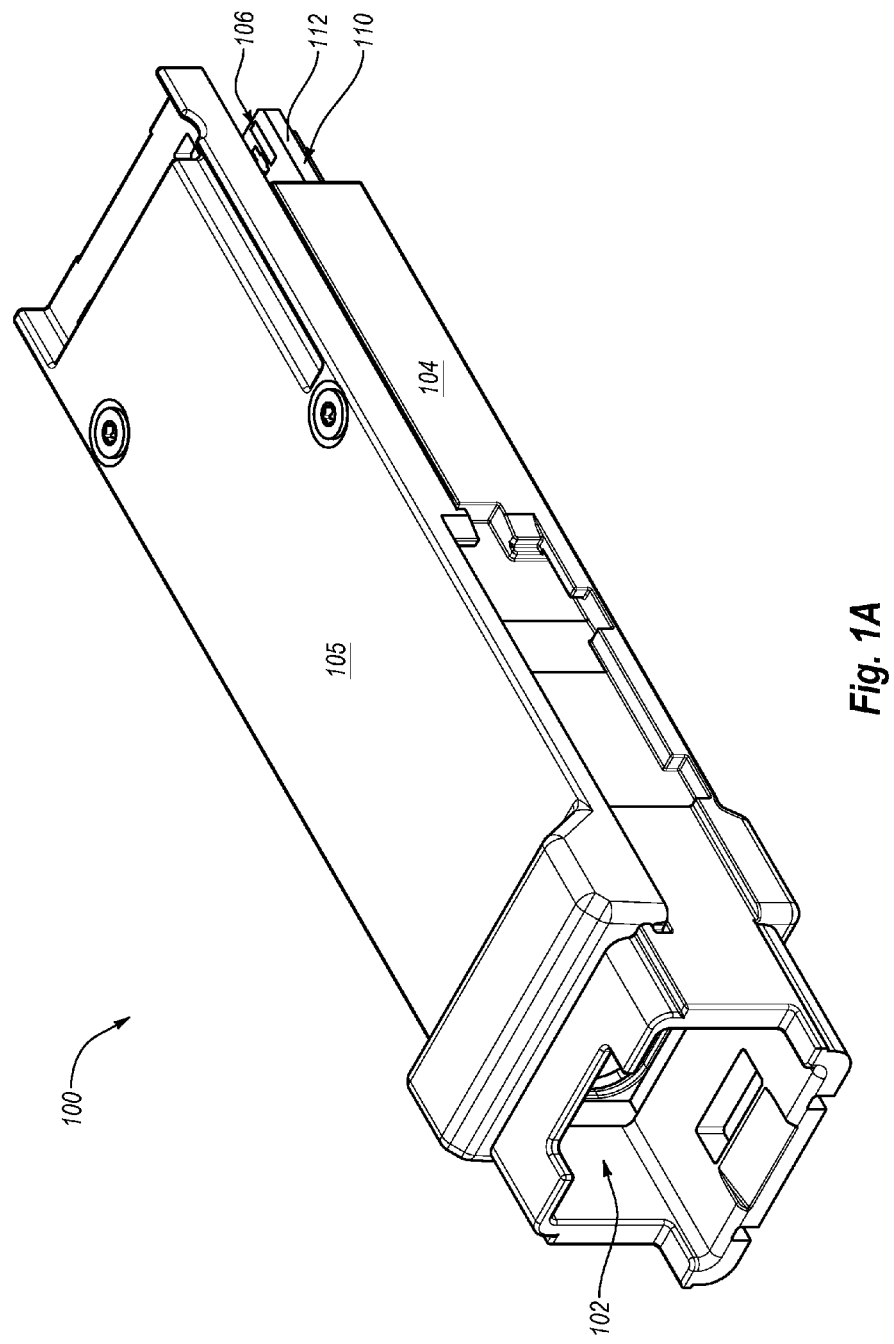
FIG. 1A illustrates a first perspective view of an example optoelectronic module.

FIG. 1A illustrates a first perspective view of an example optoelectronic module 100. The optoelectronic module 100 may be used to transmit and receive optical signals in communication with one or more other devices on a network and to communicate by way of electrical signals with a host device. The example optoelectronic module 100 may include a rigid flex PCB 110 suitable for transmitting signals having data rates above about 14 Gb/s. Including the rigid flex PCB 110 in the optoelectronic module 100 may lower manufacturing costs for the optoelectronic module 100. The rigid flex PCB 110 may be more cost effective to manufacture than other circuits able to transmit signals having data rates above about 14 Gb/s, particularly compared to other circuits including flexible and rigid sections.

The optoelectronic module 100 may transmit and receive optical signals by way of an optical communication cable (not shown) connected to the optoelectronic module 100 by way of an alignment guide 102. The alignment guide 102 may be formed in a portion of the housing 104. In some embodiments, the optoelectronic module 100 may represent one end of an "active cable" which includes two optoelectronic modules 100 attached to opposing ends of the optical communications cable. In such active cables the optoelectronic modules 100 may be permanently or releasably attached to the optical communications cable. In some embodiments, the optoelectronic device 100 may be configured to releasably connect to a communication cable. For example, the optoelectronic module 100 may include a multi-fiber push on (MPO) female connector configured to removably receive an MPO male connector of a fiber-optic communication cable.

The optoelectronic module 100 may be configured for optical signal transmission and reception at a variety of data rates. Further, the optoelectronic module 100 may be configured for optical signal transmission and reception at various wavelengths including, but not limited to, 850 nanometer (nm), 1310 nm, 1470 nm, 1490 nm, 1510 nm, 1530 nm, 1550 nm, 1570 nm, 1590 nm, 1610 nm, or longer wavelengths. The optoelectronic module 100 may be configured to support various communication protocols including, but not limited to, INFINIBAND, Fast Ethernet, Gigabit Ethernet, 10 Gigabit Ethernet, Fibre Channel, and SONET. Although the example optoelectronic module 100 is configured to be substantially compliant with the quad small form-factor pluggable (QSFP) MSA, the optoelectronic module 100 may alternately be configured to comply with a variety of other MSAs that include a rigid pluggable connector. For example, the optoelectronic module 100 may be configured to be substantially compliant with the CXP MSA.

The optoelectronic module 100 may include a shell 105 removably fastened to the housing 104. The housing 104 and shell 105 may form a body sized to allow the optoelectronic module 100 to be inserted into and/or extracted from a connection interface of a host device (not shown). When the optoelectronic module 100 is plugged into a connection interface of a host device, a dual-sided connector 106 may be configured to form a pluggable dual-sided electrically conductive connection with the connection interface of the host device. The dual-sided connector 106 may further allow the host device to physically retain the optoelectronic module 100 until the optoelectronic module 100 is purposefully unplugged from the host device. The dual-sided connector 106 may be disposed on a rigid portion of a circuit. For example, the dual-sided connector 106 may be disposed on a rigid section 112 of a rigid flex PCB 110. The rigid flex PCB 110 is made from multiple insulating layers, including flexible and rigid layers, as will be described in detail herein with reference to FIGS. 2 and 3.

Figure 1B:
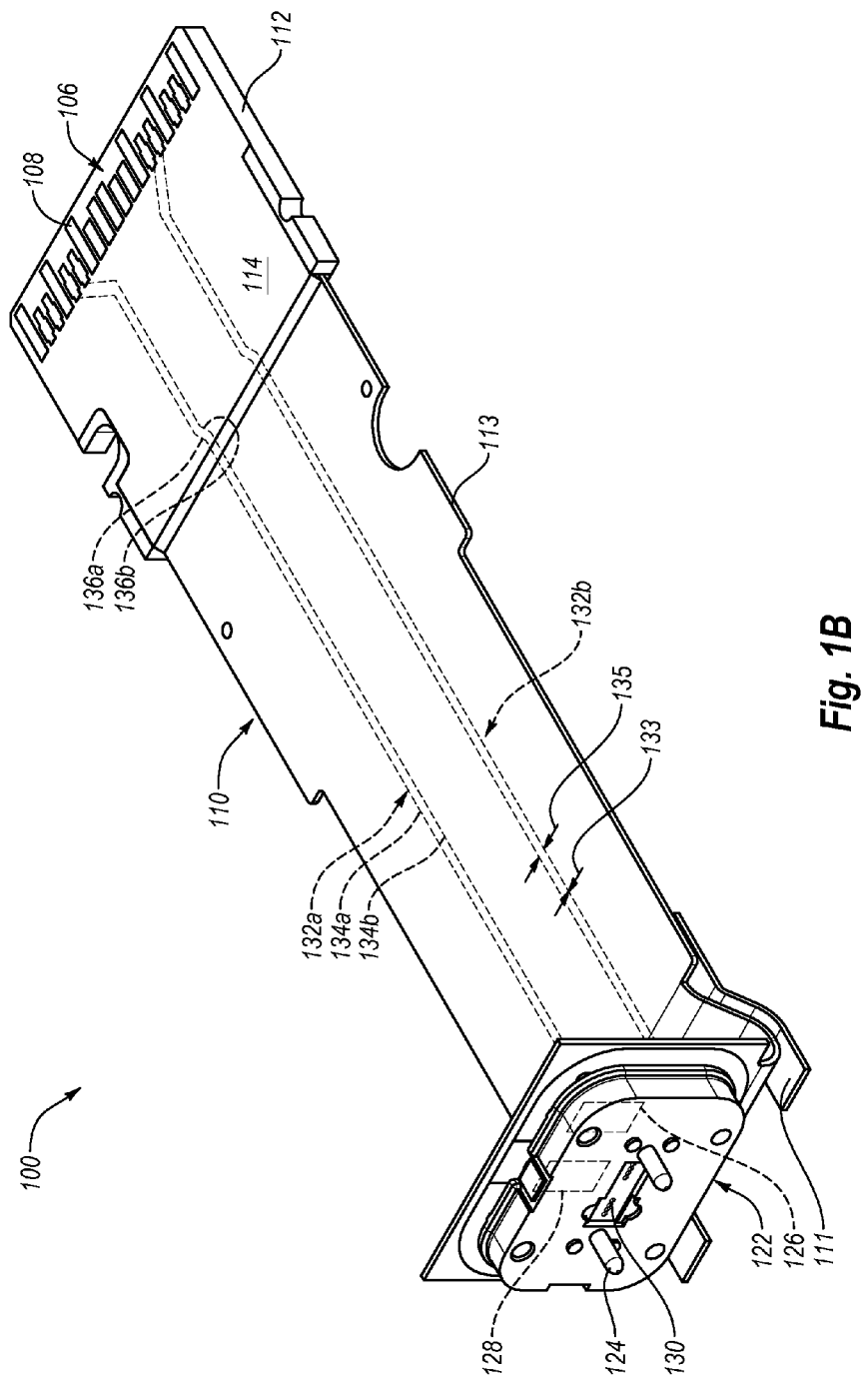
FIG. 1B illustrates the first perspective view of the example optoelectronic module of FIG. 1A with its housing and shell omitted.

FIG. 1B illustrates the first perspective view of the example optoelectronic module 100 of FIG. 1A with its housing 104 and shell 105 omitted. The rigid flex PCB 110 includes a flexible section 113. The flexible section 113 may be manipulated to form a three-dimensional shape, which may be best demonstrated in FIG. 1C. The optoelectronic module 100 may include supports 111 designed to support and/or guide the shape of sections of the flexible section 113.

Figure 1C:
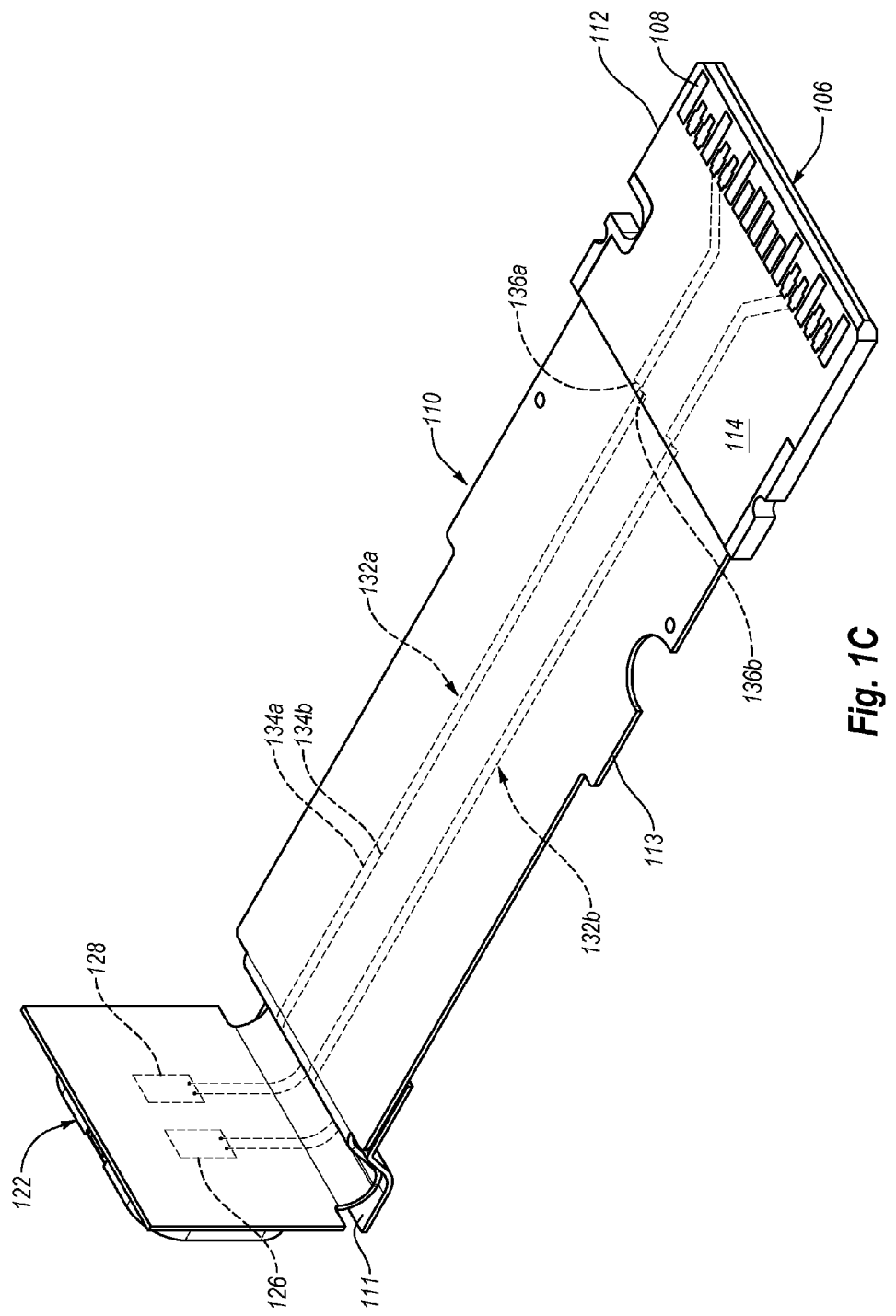
FIG. 1C illustrates a second perspective view of the example optoelectronic module of FIG. 1A with its housing and shell omitted.
Figure 1D:
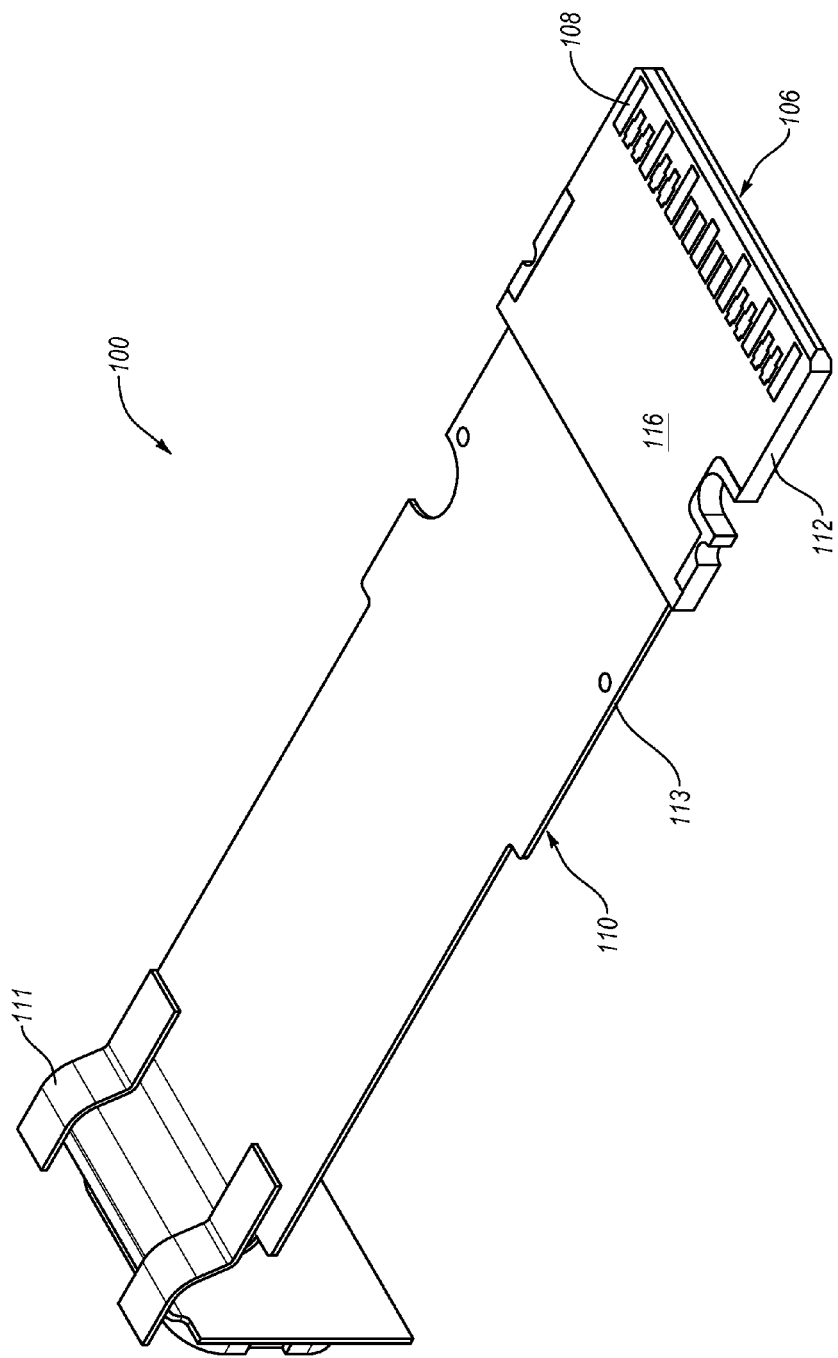
FIG. 1D illustrates a third perspective view of the example optoelectronic module of FIG. 1A with its housing and shell omitted.

The dual-sided connector 106 may be disposed on a face 114 of the rigid section 112 near an edge of the rigid section 112 of the rigid flex PCB 110. The dual-sided connector 106 may form an edge connector, as generally illustrated in FIGS. 1B-1D. The dual-sided connector 106 may include multiple contacts 108 according to a relevant MSA to form a pluggable dual-sided electrically conductive connection with corresponding contacts of a host device. Contacts 108 may be electrically coupled to signal transmission lines 132a and 132b (collectively "signal transmission lines 132"), a ground (not shown), or to one or more components (not shown) of the optoelectronic module 100. The contacts 108 may be plated with at least 30 micro-inches of nickel gold to, at least in part, encourage a conductive connection with the host device and to improve wear resistance of the contacts 108. As illustrated in FIG. 1D, the dual-sided connector 106 may include contacts 108 disposed on an opposite face 116 of the rigid section 112 of rigid flex PCB 110. The dual-sided connector 106 may include more or fewer contacts 108 than are shown in FIGS. 1B-1D.

Referring again to FIG. 1B, the optoelectronic module 100 may include a lens block 122, alignment pins 124, a transmitter 126 (shown in dashed lines), and a receiver 128 (shown in dashed lines). The optoelectronic module 100 may further include transceiver and receiver lens arrays 130 held by the lens block 122. The alignment pins 124 facilitate the alignment of the alignment guide 102 (shown in FIG. 1A) and the lens block 122. The transmitter 126 and the receiver 128 are physically and electrically connected to the flexible section 113 of the rigid flex PCB 110. The transmitter 126 and/or the receiver 128 may be electrically coupled to signal transmission lines 132a and 132b, as may be best shown in FIG. 1C. The signal transmission lines 132a and 132b may also be electrically coupled to contacts 108. Preferably, the signal transmission lines 132a and 132b are controlled-impedance transmission lines. For example, the signal transmission lines 132a and 132b may be controlled-impedance transmission lines with an impedance of 100 ohms.

Although only two signal transmission lines 132a and 132b are shown, it will be appreciated that more signal transmission lines may be included in the rigid flex PCB 110. For example, in some embodiments, four signal transmission lines are coupled to the transmitter 126 and four signal transmission lines are coupled to the receiver 128. However, another number of signal transmission lines may couple the transmitter 126 and/or receiver 128 to contacts 108. Alternately or additionally, transmission lines may couple other circuitry (not shown) on the rigid flex PCB 110 to contacts 108.

In operation, incoming optical data signals travel from a fiber-optic communications cable, through the lens block 122, and are received by the receiver 128. The receiver 128 then converts the incoming optical data signal into incoming electrical data signals. These incoming electrical signals are then passed along the signal transmission line 132a disposed on and/or in the flexible section and the rigid section 112 of the rigid flex PCB 110.

As illustrated, the signal transmission line 132a may be differential signal transmission line configured to transmit the incoming electrical data signal over a pair of differential conducive signal traces 134a and 134b. The differential conducive signal traces 134a and 134b may be disposed on one or more of the insulating layers of the rigid flex PCB 110. The signal transmission lines 132 may further include signal vias 136a, 136b disposed in the rigid flex PCB 110. The signal vias 136a, 136b may generally run through one or more insulating layers of the rigid flex PCB 110.

The conductive signal traces 134a and 134b may have a trace width 133 of about 45 micrometers or less. In addition, spacing 135 between the closest edges of each conductive signal trace 134a and 134b may be about 55 micrometers or less. Similar spacing may also be used between the conductive signal traces 134a and 134b and conductive ground trances (not shown) and/or conductive ground planes (not shown). The conductive signal traces 134a and 134b can have a relatively low surface roughness. In some embodiments, the root mean square surface roughness of the conductive traces is equal to or below 20 micrometers.

As illustrated, the signal transmission line 132a may be formed as a differential signal transmission line including conductive signal traces 134a and 134b. In some embodiments, the conductive signal traces 134a and 134b, conductive ground traces (not shown) and/or conductive ground planes (not shown) may be configured to form a microstrip differential transmission line, discussed in further detail below. Alternately or additionally, the conductive signal traces 134a and 134b, conductive ground traces (not shown) and/or conductive ground planes (not shown) may be configured to form a stripline differential transmission line, discussed in further detail below. In some embodiments, a signal transmission line other than a differential signal transmission line may be used.

Although the signal transmission lines 132 are illustrated as uninterrupted transmission lines, the incoming electrical signals may be refined by receiver circuitry such as a preamp or the like (not shown) on or in the rigid flex PCB 110. After passing along the signal transmission line 132a and through receiver circuitry, the incoming electrical data signals are passed to contacts 108 and passed to the host device in which the optoelectronic module 100 is positioned by way of the dual-sided connector 106.

Similarly, outgoing electrical data signals are passed to contacts 108 from the host device in which the optoelectronic module 100 is positioned by way of the dual-sided connector 106. These outgoing electrical data signals are transmitted along signal transmission lines 132b. The signal transmission lines 132b may generally correspond to the signal transmission lines 132a; however, the outgoing electrical signals may be refined by transmitter circuitry such as a processor or the like (not shown) on or in the rigid flex PCB 110. The outgoing electrical data signal is passed along to the transmitter 126, which converts the outgoing electrical data signal to an outgoing optical data signal. The outing optical data signal is then sent through the lens block 122 and into the fiber-optic communications cable.

The transmitter 126 may be an optical transmitter such as a vertical cavity surface emitting laser (VCSEL), or the like. The receiver 128 may be an optical receiver such as a photodetector, or the like. For example, the transmitter 126 may be a twelve-channel VCSEL array and the receiver 128 may be a twelve-channel PIN photodetector array. In some embodiments, only the transmitter 126 or receiver 128 is included in the optoelectronic module 100, such that the optoelectronic module 100 becomes only an optical transmitter or receiver, respectively.

Figure 2:
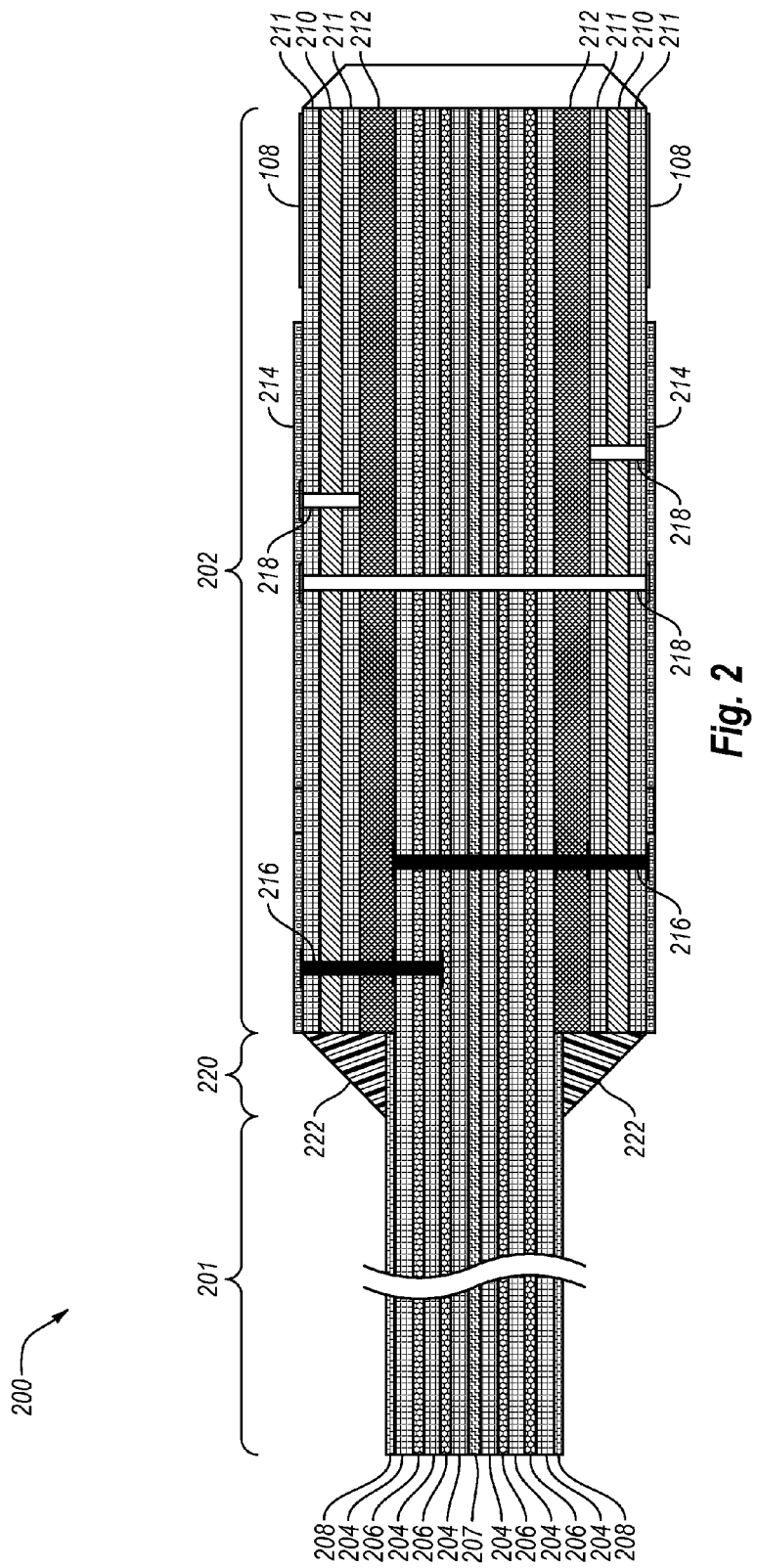
FIG. 2 illustrates a schematic cross-section of an example rigid flex PCB that may be included in the optoelectronic module of FIG. 1.

FIG. 2 illustrates a schematic cross-section of a rigid flex PCB 200 that may be used in the optoelectronic module 100 of FIG. 1, or another optoelectronic module. The rigid flex PCB 200 may include a flexible section 201, a rigid section 202, and a transition 220 between the flexible section 201 and rigid section 202.

The rigid flex PCB 200 can include copper layers 204. The copper layers 204 may include signal traces, ground traces, ground planes, bond pads, and the like. The signal traces that may be included in the copper layers 204 may generally correspond to the conductive signal traces 134a and 134b described with reference to FIGS. 1B-1C.

The rigid flex PCB 200 includes multiple high-speed flexible insulating layers 206. The high-speed flexible insulating layers 206 may have a dissipation factor equal to or below a ratio of 0.004. The high-speed flexible insulating layers 206 may also have a dielectric constant equal to or below a ratio of 3.7. The high-speed flexible insulating layers 206 may be formed from no-flow laminates and/or prepregs, low-flow laminates and/or prepregs, polyimide, and/or liquid crystal polymer.

The rigid flex PCB 200 may include a standard-speed flexible insulating layer 207. The standard-speed flexible insulating layer 207 may be formed from a variety of ordinary flexible PCB insulating materials. However, in some embodiments, the standard-speed flexible insulating layer 207 may be replaced by high-speed flexible insulating layers generally corresponding to the high-speed flexible insulating layers 206.

Flexible cover layers 208 may be formed on the flexible section 201 of the rigid flex PCB 200. The flexible cover layers 208 may have a dissipation factor equal to or below a ratio of 0.004.

The rigid section 202 is disposed on a portion of the stacked flexible layers 204, 206 and 207. Although optional, in some embodiments, the rigid flex PCB 200 may include a transition 220 between the flexible section 201 and rigid section 202 as shown in FIG. 2. The transition 220 may be formed by fabricating fillets 222 at the junction of the flexible section 201 and rigid section 202 as disclosed in FIG. 2. The fillets 222 may be fabricated from a relatively pliable material such as silicone and/or polyimide resin, or the like. The fillets 222 may have a dissipation factor equal to or below a ratio of 0.004. The transition 220 may relieve potentially damaging mechanical stress that might otherwise occur between the flexible section 201 and rigid section 202 when the flexible section 201 is bent near the rigid section 202. The transition 220 may transition the thickness of the rigid flex PCB 200 from the relatively thick rigid section 202 to the relatively thin flexible section 201.

The rigid section 202 includes high-speed rigid insulating layers 210. The high-speed rigid insulating layers 210 may have a dissipation factor equal to or below a ratio of 0.004. The high-speed rigid insulating layers 210 may also have a dielectric constant equal to or below a ratio of 3.7. The high-speed rigid insulating layers 210 may be formed from puffed polytetrafluoroethylene (PTFE), ceramic-filled PTFE, no-flow laminates and/or prepregs, low-flow laminates and/or prepregs, polyimide, and/or liquid crystal polymer.

In some embodiments, the rigid section 202 includes standard-speed rigid insulating layers 212. The standard-speed rigid insulating layer 212 may be formed form a variety of ordinary rigid PCB insulating materials. However, in some embodiments, the standard-speed rigid insulating layers 212 may be replaced by high-speed rigid insulating layers generally corresponding to the high-speed rigid insulating layers 210.

Contacts 108 are positioned on a portion of the rigid section 202. The contacts 108 may generally correspond to the contacts 108 described with reference to FIGS. 1B-1D. The contacts 108 may be connected electrically to copper layers 211 and/or copper layers 204.

The thickness of the rigid section 202 may correspond to a thickness that allows the contacts 108 and/or the rigid section 202 to interface with a host device. The thickness of the rigid section 202 may be influenced by the type of optoelectronic devices in which the rigid flex PCB 200 may be employed.

The copper layers 204 and 211 are electrically coupled by way of filled vias 216 and hollow vias 218. The filled vias 216 and hollow vias 218 may include blind vias, buried vias, button plated vias, stitched vias, thermal vias, and the like. The hollow vias 218 may be formed as a conductive tube passing through one or more layers of the rigid flex PCB to electrically couple two or more copper layers. The conductive tube of the hollow vias 218 may be formed from copper, gold, or the like. The filled vias 216 may be formed as a conductive tube generally corresponding to the hollow vias 218; however, the filled vias 216 are filled with a conductive material such as copper, ferrite, ferrous powder, silver epoxy, conductive paste, gold or the like.

In some embodiments, one or more filled vias 216 may have a height measuring more than ten times its diameter. To form a filled via 216 having a height more than ten times its diameter, the filled via 216 may be formed in multiple shorter sections and then combined into a taller via using thermal compression bonding. For example, insulating layers of the rigid flex PCB 200 may be stacked such that multiple vias are stacked end-to-end. Then, through application of heat and force, the multiple vias may bond end-to-end through diffusion to form a longer via. In some embodiments, relatively low-temperature thermal compression bonding techniques, such as those employed in manufacturing 3D integrated circuits (ICs), may be employed. The resulting filled via 216 may form a stable filled via 216 that allows for transmission of a high-frequency signal. The resulting filled via 216 may resist, if not eliminate, oxidation of the filled via 216. Furthermore, the filled via 216 may resist cracking—and thus possible signal degradation—when strain is introduced to the filled via 216.

The copper layers 204 may form stripline signal transmission lines on either side of the standard-speed flexible insulating layer 207. For example, the copper layers 204 may form a stripline having one or more signal traces disposed between ground planes. The copper layers 211 may form microstrip signal transmission lines on either side of the rigid section 202. For example, the copper layers 204 may form a microstrip having one or more signal traces disposed above or below ground planes. The stripline signal traces may be electrically coupled to the microstrip signal traces by way of filled vias 216. The stripline ground planes may be electrically coupled to the microstrip ground planes by way of hollow vias 218. In some embodiments, the relative positions of the filled vias 216 and hollow vias 218 may be adjusted to minimize the signal loss of a signal transmitted by way of the rigid flex PCB 200.

Cover layers 214 may be positioned on a portion of the rigid section 202. The cover layers 214 are preferably rigid cover layers; however, flexible cover layers may be used. In some embodiments, the high-speed cover layers 214 may have a dissipation factor equal to or below a ratio of 0.004.

Figure 3:
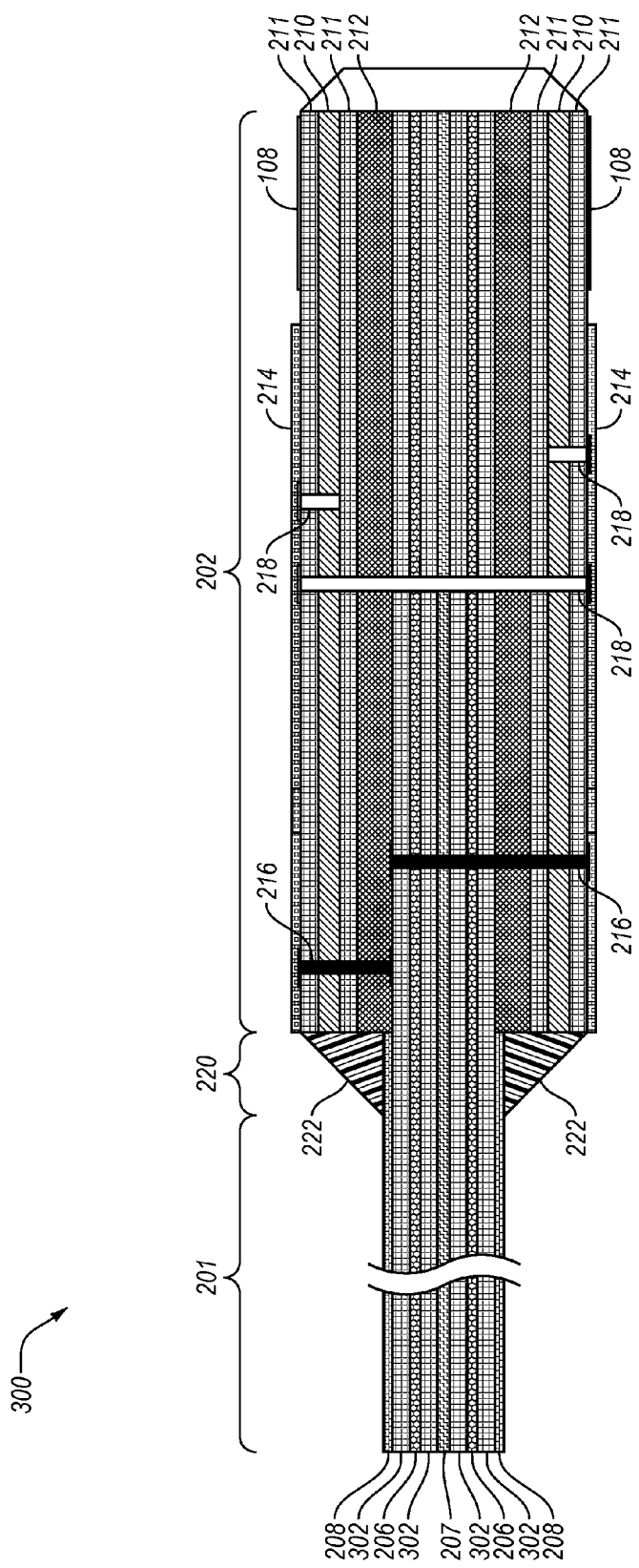
FIG. 3 illustrates a schematic cross-section of another example rigid flex PCB that may be included in the optoelectronic module of FIG. 1.

FIG. 3 illustrates another schematic cross-section of a rigid flex PCB 300 that may be used in the optoelectronic module 100 of FIG. 1, or another optoelectronic module. The rigid flex PCB 300 may include a flexible section 201, a rigid section 202, high-speed flexible insulating layers 206, a standard-speed flexible insulating layer 207, flexible cover layers 208, high-speed rigid insulating layers 210, copper layers 211, contacts 108, cover layers 214, filled vias 216, hollow vias 218, standard-speed insulating layers 212, a transition 220, and fillets 222 generally corresponding to those described with reference to FIG. 2.

The rigid flex PCB 300 further includes copper layers 302. The copper layers 302 may include signal traces such as microstrip and/or stripline transmission lines, ground traces, ground planes, wire bond pads, and the like. The signal traces that may be included in the copper layers 302 may generally correspond to the conductive signal traces 134*a* and 134*b* described with reference to FIGS. 1A-1C. The copper layers 302 may form microstrip signal transmission lines on either side of the standard-speed flexible insulating layer 207. For example, the copper layers 302 may form a microstrip having one or more signal traces disposed above or below ground planes. The microstrip signal traces formed from the copper layers 302 may be electrically coupled to the microstrip signal traces formed from the copper layers 211 by way of low capacitance, micro filled vias 216. The microstrip ground planes formed from the copper layers 302 may be electrically coupled to the microstrip ground planes formed from the copper layers 211 by way of hollow vias 218.

In some embodiments, printed passive components may be fabricated in the rigid flex PCBs 110, 200 and 300. Printed passive components may be designed using geometries of signal traces, ground traces and/or ground planes formed in the copper layers 204 and 211. Printed passive components may be used in place of equivalent external components because high frequencies of the high speed signals transmitted through the rigid flex PCB 110, 200 and 300 may cause printed passive components to exhibit meaningful signal conditioning on the high speed signals. In some embodiments, the rigid flex PCB 110, 200 and 300 may include a printed passive component such as a quadrupole inductor, a bias tee, a power filter, a power divider, a tuning circuit, a single-pole signal filter, a multiple-pole signal filter, a common mode choke, and/or a pulse transformer to replace and/or complement external components.

Figure 4:
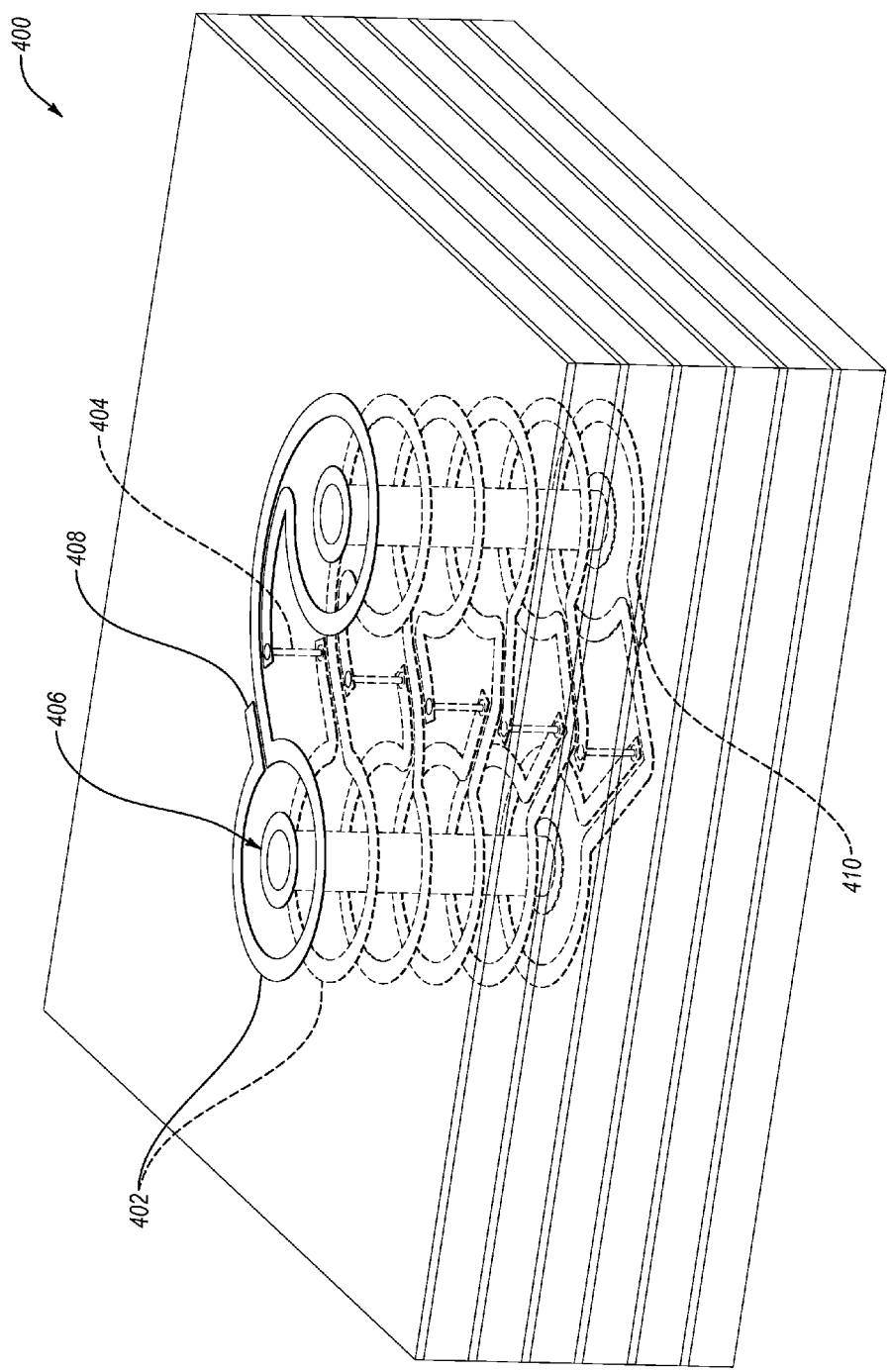
FIG. 4 illustrates an example printed passive quadrupole inductor that may be included in the example rigid flex PCBs of FIGS. 2 and 3.

FIG. 4 illustrates an example printed passive quadrupole inductor 400 that may be fabricated in the rigid flex PCBs 200 and 300 of FIGS. 2 and 3. The printed passive quadrupole inductor 400 may include a quadrupole loop formed from signal traces 402 and vias 404 as disclosed in FIG. 4. The printed passive quadrupole inductor 400 may further include ferrous filled vias 406 formed through each loop of the quadrupole loop. The ferrous filled vias 406 may include a hollow copper via filled with a ferrous metal. The printed passive quadrupole inductor 400 may be formed in a transmission line generally corresponding to the signal transmission lines 132*a* and 132*b* as described with reference to FIGS. 1B-1C. For example, a first end 408 may be electrically coupled by way of a conductive signal trace to a contact generally corresponding to the contacts 108 described with reference to FIGS. 1B-1D. A second end 410 may be electrically coupled by way of a conductive signal trace to a transmitter or receiver generally corresponding to the transmitter 126 or receiver 128 described with reference to FIGS. 1B-1C. The printed passive quadrupole inductor 400 may condition the signal passing through the printed passive quadrupole inductor 400.

The printed passive quadrupole inductor 400 may produce a desired parasitic inductance at the signal frequencies transmitted and received by an optoelectronic module generally corresponding to the optoelectronic module 100 described with reference to FIGS. 1A-1D. For example, the passive quadrupole inductor 400 may exhibit an inductance between 90 and 110 picohenries when a signal having a frequency above 14 GHz is passed through the printed passive quadrupole inductor 400. Fabricating the printed passive quadrupole inductor 400 directly into a rigid flex PCB may allow signal conditioning without the need for external components.

Additional printed passive components may be fabricated in a manner similar to the printed passive quadrupole inductor 400. These additional printed passive components may be designed to exhibit desired characteristics at the signal frequencies transmitted and received by an optoelectronic module. For example, a bias tee, a power filter, a power divider, a tuning circuit, a single-pole signal filter, a multiple-pole signal filter, a common mode choke, and/or a pulse transformer may be fabricated directly into a rigid flex PCB.

Figure 5:
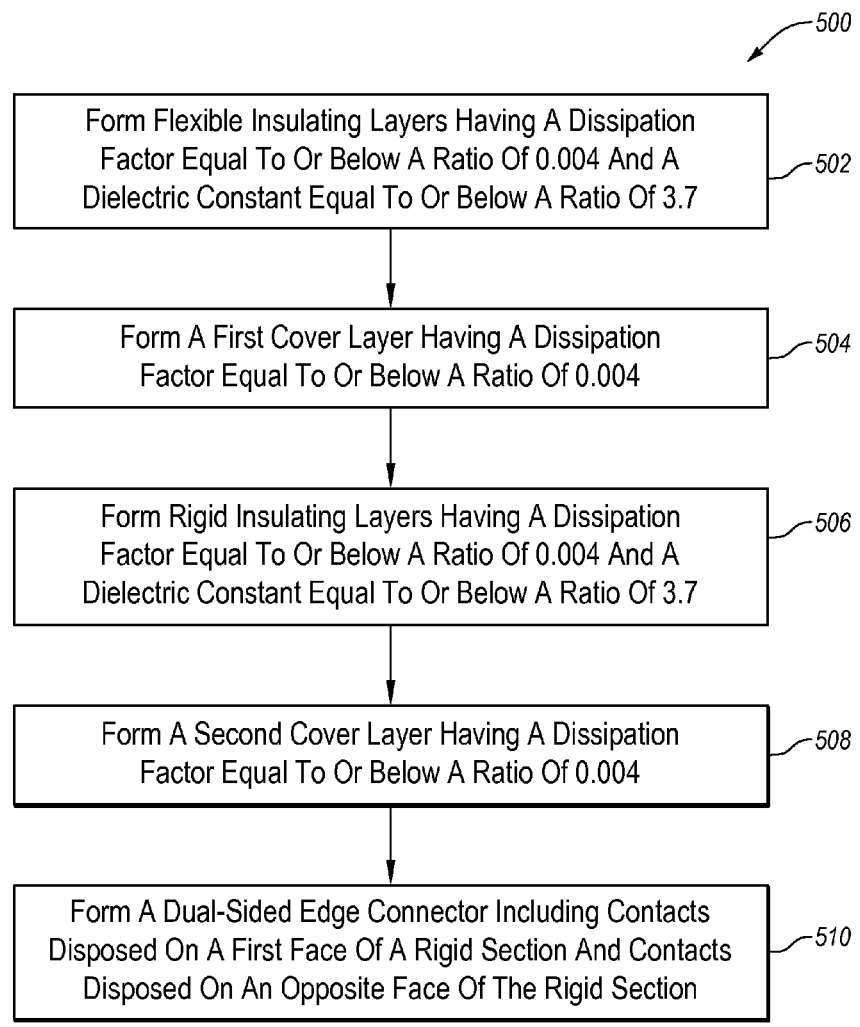
FIG. 5 is a flowchart of an example method of manufacturing a rigid flex PCB.

FIG. 5 is a flowchart of an example method 500 of manufacturing a rigid flex PCB. The method 500 may be implemented, in some embodiments, to manufacture a rigid flex PCB including a dual-sided rigid end connector suitable for transmitting high frequency signals. In particular, the method 500 may be implemented to manufacture a rigid flex PCB as described with reference to FIGS. 1A-3. It will be appreciated that the rigid flex PCB may be manufactured using a method other than the one disclosed here. As shown in block 502, the method may include forming flexible insulating layers having a dissipation factor equal to or below a ratio of 0.004 and a dielectric constant equal to or below a ratio of 3.7. The flexible insulating layers may be formed through lamination cycles.

As the flexible insulating layers are formed, portions of differential signal transmission lines may be formed on one or more of the insulating layers. The portions of the differential signal transmission lines may each include two differential signal traces, each signal trace having a trace width equal to or less than 45 micrometers. The two differential signal traces may also have a space equal to or less than 55 micrometers between the signal traces. The signal traces may also have a root mean square surface roughness equal to or below 20 micrometers. In some embodiments, the signal traces may be formed from rolled annealed copper or by electrodeposited copper.

The portions of the differential signal transmission lines may also include one or more filled signal vias electrically coupled to the one or more signal transmission lines. The filled signal vias may be formed to pass through at least one flexible insulating layer. In some embodiments, the filled signal vias may be formed by way of thermal compression bonding, via buildup, and/or sequential lamination.

In block 504, the method may include forming a first cover layer having a dissipation factor equal to or below a ratio of 0.004.

In block 506, the method may include forming rigid insulating layers having a dissipation factor equal to or below a ratio of 0.004 and a dielectric constant equal to or below a ratio of 3.7. The rigid insulating layers may be formed through lamination cycles. The rigid insulating layers may be formed on a portion of the flexible insulating layers to form a rigid section. A remaining portion of the flexible insulating layers may form a flexible section.

As the rigid insulating layers are formed, additional portions of the differential signal transmission lines may be formed on one or more of the rigid insulating layers. The additional portions of the differential signal transmission lines formed on the rigid insulating layers generally correspond to, and are generally electrically connected to the portions of the differential signal transmission lines formed on the flexible insulating layers. However, the filled signal vias formed in the rigid insulating layers may be formed to pass through at least one or more rigid insulating layer.

In block 508, the method may include forming a second cover layer having a dissipation factor equal to or below a ratio of 0.004.

In block 510, the method may include forming a dual-sided edge connector configured to form a pluggable conductive connection. The dual-sided edge connector may include contacts disposed on a first face of the rigid section and contacts disposed on an opposite face of the rigid section. The contacts may be electroplated with at least 30 micro-inches of nickel gold. Some of the multiple contacts may be electrically coupled to the differential signal transmission lines.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit comprising:
   a flexible section including a first portion of a flexible insulating layer;
   a rigid section including:
      a second portion of the flexible insulating layer,
      a first rigid insulating layer disposed on a first side of the second portion of the flexible insulating layer, and
      a second rigid insulating layer disposed on a second side of the second portion of the flexible insulating layer;
   a connector disposed on the rigid section, the connector configured to form a pluggable dual-sided, electrically conductive connection;
   an electrically conductive signal transmission line electrically coupled to the connector, the electrically conductive signal transmission line including:
      a first signal trace having a root mean square surface roughness equal to or below 20 micrometers, and
      a filled signal via configured to pass through at least a portion of the rigid insulating layer;
   a transition between the flexible section and the rigid section, the transition including fillets of pliable materials at the junction of the flexible section and the rigid section; and
   a printed passive component coupled to the electrically conductive signal transmission line, the printed passive component formed at least in part from a geometry of a signal trace in the rigid section or the flexible section,
   wherein the flexible insulating layer and the rigid insulating layer have a dissipation factor equal to or below 0.004 and a dielectric constant equal to or below 3.7.

2. The circuit of claim 1, wherein the connector comprises an edge connector disposed on two opposite faces of the rigid section.

3. The circuit of claim 2, wherein the edge connector includes:
   a first plurality of contacts disposed on a first face of the rigid section, and
   a second plurality of contacts disposed opposite of the first plurality of contacts on a second face of the rigid section opposite the first face of the rigid section.

4. The circuit of claim 1, further comprising:
   a first cover layer disposed on the flexible section; and
   a second cover layer disposed on the rigid section,
   wherein the first cover layer and the second cover layer have a dissipation factor equal to or below 0.004.

5. The circuit of claim 1, wherein the flexible insulating layer comprises at least one of: no-flow prepreg, low-flow prepreg, polyimide, or liquid crystal polymer.

6. The circuit of claim 1, wherein the rigid insulating layer comprises at least one of: no-flow prepreg, low-flow prepreg, polyimide, liquid crystal polymer, puffed polytetrafluoroethylene (PTFE), or ceramic-filled PTFE.

7. The circuit of claim 1, wherein the circuit is configured to transmit a signal having a data rate at or faster than 14 gigabits per second.

8. The circuit of claim 1, wherein the electrically conductive signal transmission line includes a differential signal transmission line.

9. The circuit of claim 1, wherein the first signal trace has a width of less than or equal to 45 micrometers.

10. The circuit of claim 1, wherein:
    the electrically conductive signal transmission line further includes a second signal trace, and
    the first signal trace and the second signal trace are separated by less than or equal to 55 micrometers.

11. The circuit of claim 1, wherein a height of the filled signal via is more than ten times a diameter of the filled signal via.

12. The circuit of claim 1, wherein the filled signal via is filled with at least one of: copper, ferrite, ferrous powder, silver epoxy, and conductive paste.

13. The circuit of claim 1, wherein the printed passive component includes at least one of: a bias tee, a power filter, a power divider, a tuning circuit, a single-pole signal filter, a multiple-pole signal filter, a common mode choke, or a pulse transformer.

14. The circuit of claim 1, wherein the printed passive component includes a quadrupole inductor including a quadrupole loop having two loops, the printed passive quadrupole inductor further including two ferrous filled vias located within each loop of the quadrupole loop.

15. An optoelectronic module comprising:
an optical transmitter;
an optical receiver;
an edge connector configured to form a pluggable conductive connection for the optoelectronic module with a host device, the edge connector disposed on a rigid section of a circuit configured to electrically couple the optical transmitter and optical receiver with the edge connector, the circuit including:
a flexible section including a first portion of a flexible insulating layer;
a rigid section including:
a second portion of the flexible insulating layer,
a first rigid insulating layer disposed on a first side of the second portion of the flexible insulating layer, and
a second rigid insulating layer disposed on a second side of the second portion of the flexible insulating layer;
an electrically conductive signal transmission line electrically coupled to the edge connector, the electrically conductive signal transmission line including:
a first signal trace having a root mean square surface roughness equal to or below 20 micrometers, and
a filled signal via configured to pass through at least a portion of the rigid insulating layer;
a transition between the flexible section and the rigid section, the transition including fillets of pliable materials at the junction of the flexible section and the rigid section; and
a printed passive component coupled to the electrically conductive signal transmission line, the printed passive component formed at least in part from a geometry of a signal trace in the rigid section or the flexible section,
wherein the flexible insulating layer and the rigid insulating layer have a dissipation factor equal to or below 0.004 and a dielectric constant equal to or below 3.7.

16. The optoelectronic module of claim 15, wherein the edge connector includes:
a first plurality of contacts disposed on a first face of the rigid section, and
a second plurality of contacts disposed opposite the first plurality of contacts on a second face of the rigid section opposite the first face of the rigid section.

17. The optoelectronic module of claim 15, wherein the optoelectronic module is configured to transmit a signal having a data rate at or above 14 gigabits per second.

18. The optoelectronic module of claim 15, wherein the printed passive component includes a quadrupole inductor including a quadrupole loop having two loops, the printed passive quadrupole inductor further including two ferrous filled vias located within each loop of the quadrupole loop.

19. The optoelectronic module of claim 15, wherein the printed passive component includes at least one of: a bias tee, a power filter, a power divider, a tuning circuit, a single-pole signal filter, a multiple-pole signal filter, a common mode choke, or a pulse transformer.

20. A circuit comprising:
a plurality of insulating layers including:
a plurality of flexible insulating layers, the plurality of flexible insulating layers having:
a dissipation factor equal to or below 0.004, and
a dielectric constant equal to or below 3.7, and
a plurality of rigid insulating layers, the plurality of rigid insulating layers having:
a dissipation factor equal to or below 0.004, and
a dielectric constant equal to or below 3.7,
a first cover layer having a dissipation factor equal to or below 0.004,
a second cover layer having a dissipation factor equal to or below 0.004;
a plurality of differential signal transmission lines, each differential signal transmission line including:
two differential signal traces disposed on one or more of the plurality of insulating layers, the two differential signal traces having:
a trace width of about 45 micrometers,
spacing between the two differential signal traces of about 55 micrometers, and
a root mean square surface roughness equal to or below 20 micrometers, and
one or more filled signal vias electrically coupled to the one or more differential signal transmission lines, the one or more filled signal vias configured to pass through at least a section of the plurality of insulating layers,
a flexible section including a first portion of the plurality of flexible insulating layers without the plurality of rigid layers disposed on the plurality of flexible insulating layers and the first cover layer;
a rigid section including:
a first rigid insulating layer of the plurality of rigid insulating layers disposed on a first side of a second portion of the plurality of flexible insulating layers,
a second rigid insulating layer of the plurality of rigid insulating layers disposed on a second side of the second portion of the plurality of flexible insulating layers,
the second cover layer, and
an edge connector configured to form a pluggable conductive connection, the edge connector including:
a first plurality of contacts disposed on a first face of the rigid section, and
a second plurality of contacts disposed opposite the first plurality of contacts on a second face of the rigid section opposite the first face of the rigid section,
wherein:
some of the first plurality of contacts and the second plurality of contacts are electrically coupled to the plurality of differential signal transmission lines, and
each contact of the first plurality of contacts and the second plurality of contacts is plated with at least 30 micro-inches of nickel gold;
a transition between the flexible section and the rigid section, the transition including fillets of pliable materials at the junction of the flexible section and the rigid section; and a printed passive quadrupole inductor coupled to at least one of the one or more differential signal transmission lines, the printed passive quadrupole inductor including a quadrupole loop having two loops, the printed passive quadrupole inductor further including two ferrous filled vias located within each loop of the quadrupole loop.

* * * * *